(12) United States Patent
Ueyama et al.

(10) Patent No.: US 11,808,533 B2
(45) Date of Patent: Nov. 7, 2023

(54) COOLING UNIT

(71) Applicant: Toyota Jidosha Kabushiki Kaisha, Toyota (JP)

(72) Inventors: Toshinari Ueyama, Toyota (JP); Kenjiro Shiba, Takahama (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 69 days.

(21) Appl. No.: 17/367,907

(22) Filed: Jul. 6, 2021

(65) Prior Publication Data
US 2022/0011060 A1    Jan. 13, 2022

(30) Foreign Application Priority Data
Jul. 10, 2020    (JP) .................................. 2020-119351

(51) Int. Cl.
*F28F 9/00* (2006.01)
*H05K 7/20* (2006.01)

(52) U.S. Cl.
CPC ............. *F28F 9/005* (2013.01); *H05K 7/209* (2013.01); *H05K 7/20918* (2013.01); *F28F 2265/28* (2013.01)

(58) Field of Classification Search
CPC ............. F28D 2021/0029; F28F 9/005; F28F 2265/28; H05K 5/0217; H05K 7/209; H05K 7/20909; H05K 7/20918
See application file for complete search history.

(56) References Cited

U.S. PATENT DOCUMENTS

| | | | | |
|---|---|---|---|---|
| 2,455,708 | A * | 12/1948 | Sherwin ................... | F02F 1/06 181/207 |
| 3,235,001 | A * | 2/1966 | Giannotti ................. | F28D 7/08 165/135 |
| 6,233,149 | B1 * | 5/2001 | Bailey ................ | H05K 7/20918 361/679.01 |
| 10,104,760 | B1 * | 10/2018 | Briant .................. | G02B 6/4284 |
| 10,401,681 | B1 * | 9/2019 | Katagiri ............. | H05K 7/20963 |
| 2012/0262879 | A1 * | 10/2012 | Inoue ................. | H05K 7/20154 361/697 |
| 2013/0025837 | A1 * | 1/2013 | Takenaga ............... | H01L 23/473 165/168 |
| 2020/0232711 | A1 * | 7/2020 | Kim .................. | H05K 7/20918 |
| 2020/0376614 | A1 * | 12/2020 | Zhu .......................... | F28F 3/12 |

FOREIGN PATENT DOCUMENTS

| | | |
|---|---|---|
| JP | 2008-187754 A | 8/2008 |
| JP | 2009-123871 A | 6/2009 |
| JP | 2012-036808 A | 2/2012 |
| JP | 2018-174692 A | 11/2018 |

* cited by examiner

*Primary Examiner* — Eric S Ruppert
*Assistant Examiner* — Hans R Weiland
(74) *Attorney, Agent, or Firm* — Dinsmore & Shohl LLP

(57) ABSTRACT

A cooling unit has a member-to-be-cooled, a duct, and a cushioning material. The member-to-be-cooled has a plurality of cooling fins. The duct is fixed to the member-to-be-cooled, has a partition wall facing the plurality of cooling fins, and conveys a fluid to around the plurality of cooling fins. The cushioning material is disposed between the partition wall and the plurality of cooling fins and fixed to the partition wall.

6 Claims, 5 Drawing Sheets

COOLING UNIT

CROSS-REFERENCE TO RELATED APPLICATION

This application claims priority to Japanese Patent Application No. 2020-119351 filed on Jul. 10, 2020, incorporated herein by reference in its entirety.

BACKGROUND

1. Technical Field

A technique to be disclosed in this specification relates to a cooling unit.

2. Description of Related Art

Japanese Patent Application Publication No. 2012-036808 discloses an air intake duct of an automobile engine.

SUMMARY

To cool a member-to-be-cooled having a plurality of cooling fins, a duct can be mounted to the member-to-be-cooled. Specifically, the duct can be mounted to the member-to-be-cooled with a partition wall of the duct facing the cooling fins so as to convey a fluid to around the cooling fins. This configuration can efficiently cool the cooling fins by the fluid. In this structure, however, if the partition wall facing the cooling fins warps, the partition wall comes into contact with the cooling fins. If the partition wall comes into contact with the cooling fins, the contact portions form noise generation sources. This specification proposes a technique for reducing noise generation in a cooling unit.

An aspect of the present disclosure relates to a cooling unit that includes a member-to-be-cooled, a duct, and a cushioning material. The member-to-be-cooled includes a plurality of cooling fins. The duct is fixed to the member-to-be-cooled, includes a partition wall facing the plurality of cooling fins, and conveys a fluid to around the plurality of cooling fins. The cushioning material is disposed between the partition wall and the plurality of cooling fins and fixed to the partition wall.

The fluid may be either a gas or a liquid.

According to the above configuration, the cooling unit includes the cushioning material that is fixed to the partition wall of the duct. The cushioning material is disposed between the partition wall and the plurality of cooling fins. Therefore, when the partition wall warps, the cushioning material comes into contact with the cooling fins. This prevents the partition wall from directly coming into contact with the cooling fins. Since the cushioning material has flexibility, even when the cushioning material comes into contact with the cooling fins, the contact portions do not form noise generation sources.

Thus, this cooling unit generates less noise.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

In one example of the cooling unit disclosed in this specification, the plurality of cooling fins may extend linearly in one direction along the partition wall. The duct may be configured to convey the fluid along the one direction.

This configuration can efficiently cool the cooling fins.

In one example of the cooling unit disclosed in this specification, the cushioning material may have a structure that does not allow the fluid to pass through the inside of the cushioning material.

In this configuration, the fluid is more likely to flow to around the cooling fins and the cooling fins can be efficiently cooled.

In one example of the cooling unit disclosed in this specification, the cushioning material may be configured by a closed-cell sponge.

A closed-cell sponge allows little fluid to pass through the inside thereof. In this configuration, therefore, the fluid is more likely to flow to around the cooling fins and the cooling fins can be efficiently cooled.

In one example of the cooling unit disclosed in this specification, an inner surface of the partition wall may have a recess. The cushioning material may be disposed inside the recess.

The inner surface is one surface of the partition wall that is on the side of the cooling fins (the surface facing the cooling fins).

In one example of the cooling unit disclosed in this specification, the cushioning material may protrude farther toward the side of the plurality of cooling fins than a part of the inner surface around the recess.

In this configuration, the clearance between the cushioning material and the cooling fins can be narrowed, so that the fluid is more likely to flow to around the cooling fins and the cooling fins can be efficiently cooled.

Figure 1:
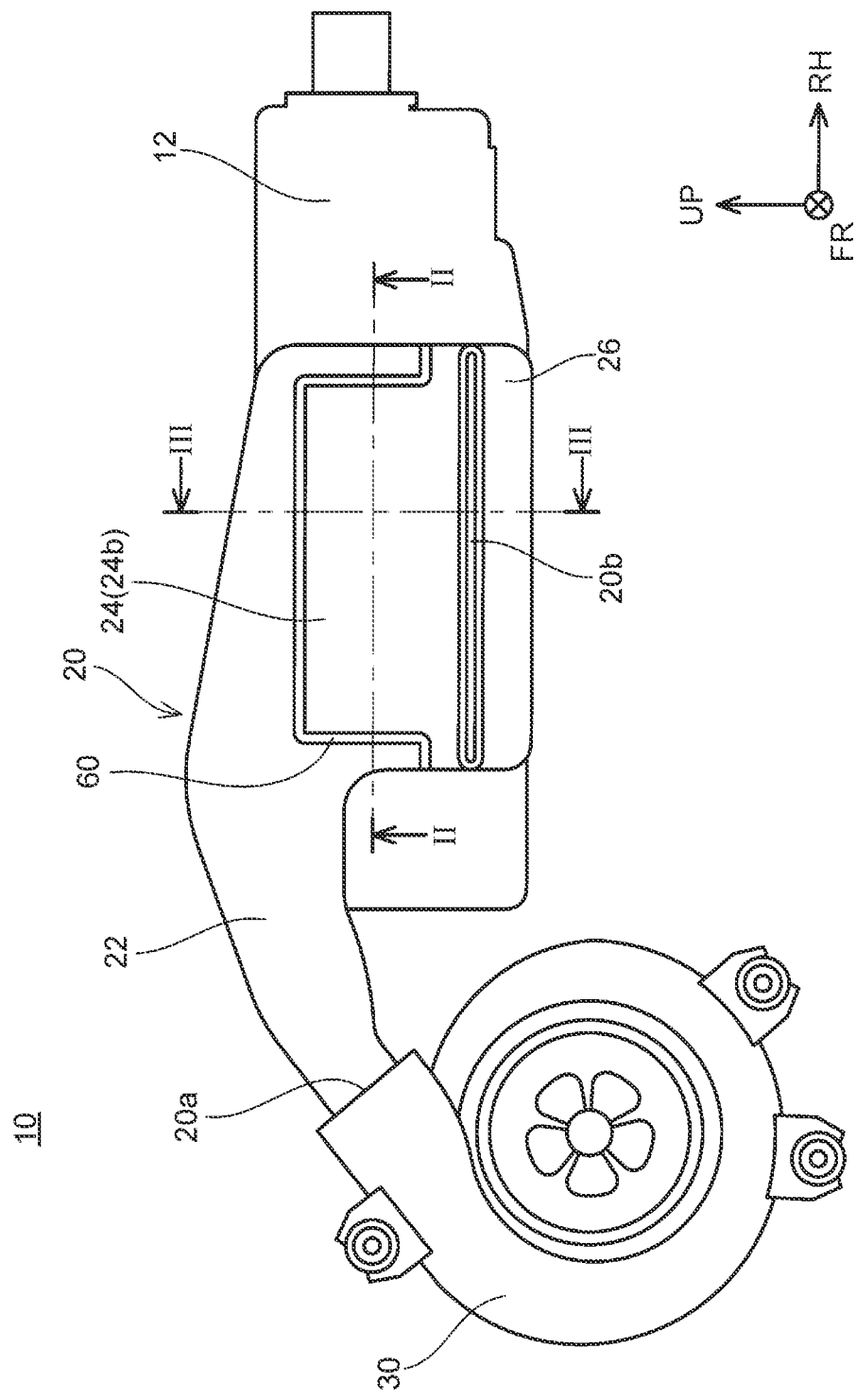
FIG. 1 is a plan view of a cooling unit.

A cooling unit 10 shown in FIG. 1 is installed in a vehicle (in this embodiment, an electric vehicle). In the drawings including FIG. 1, arrows UP, FR, and RH indicate a vehicle upward direction, a vehicle frontward direction (advancing direction), and a vehicle rightward direction, respectively. The cooling unit 10 has a DC-DC converter 12, a duct 20, and a blower 30. The DC-DC converter 12 supplies electricity to a motor of the vehicle. The duct 20 is mounted on the DC-DC converter 12. The blower 30 sends air into the duct 20. The air flowing through the duct 20 cools the DC-DC converter 12.

Figure 2:
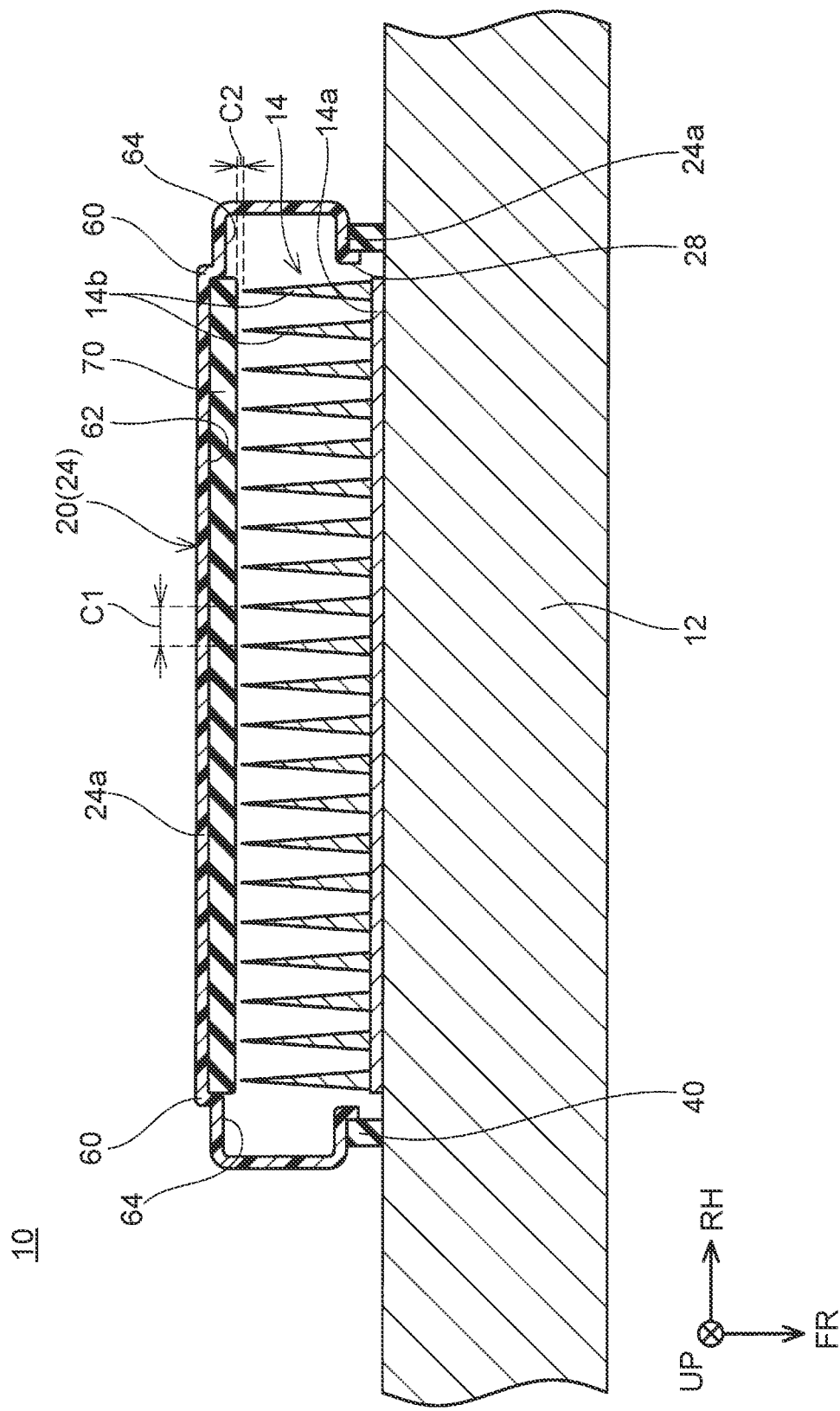
FIG. 2 is a sectional view taken along line II-II of FIG. 1.
Figure 3:
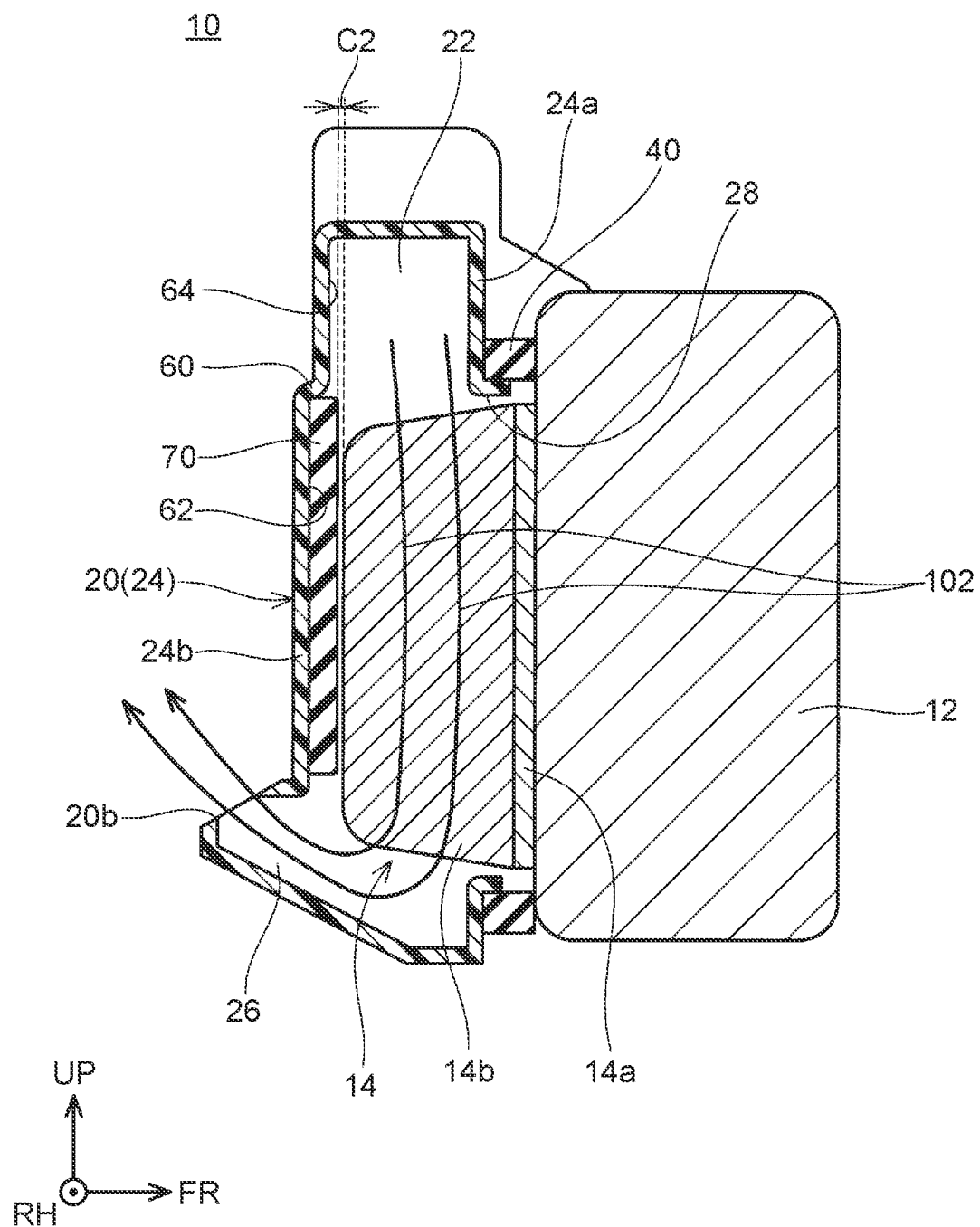
FIG. 3 is a sectional view taken along line of FIG. 1.

As shown in FIG. 2 and FIG. 3, the DC-DC converter 12 has a heatsink 14. The heatsink 14 is provided on a rear-side surface of the DC-DC converter 12. The heatsink 14 dissipates heat produced inside the DC-DC converter 12. The heatsink 14 has a baseplate 14a and a plurality of cooling fins 14b. The cooling fins 14b are erected on the baseplate 14a. The cooling fins 14b protrude from the baseplate 14a toward a rear side. The cooling fins 14b extend linearly along an up-down direction.

Figure 4:
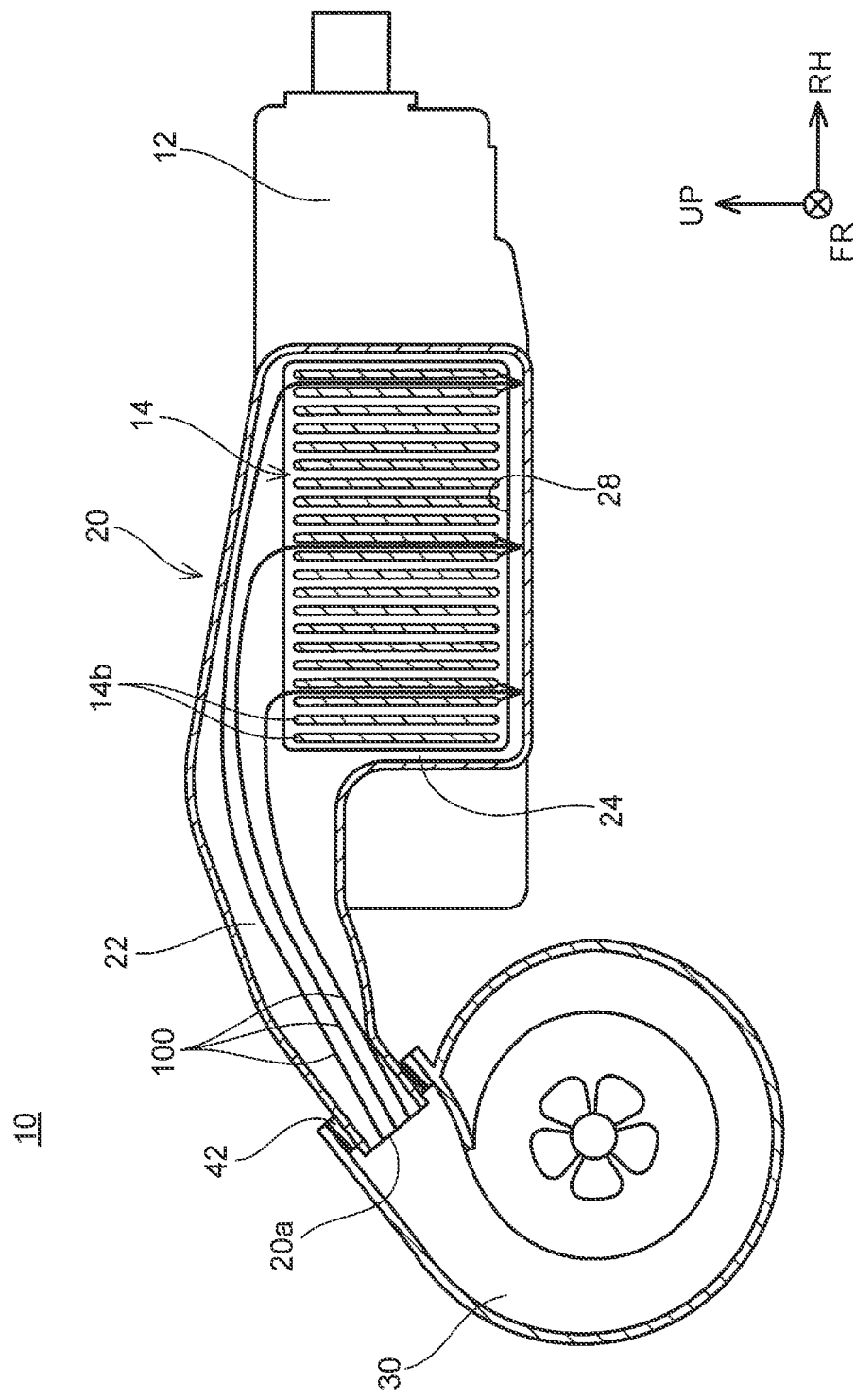
FIG. 4 is a plan view with a duct shown in section.

As shown in FIG. 1, the duct 20 is a tubular resin part extending from an inlet 20a to an outlet 20b. The duct 20 has an upstream part 22, a main part 24, and a downstream part 26. The main part 24 has a box shape. The upstream part 22 connects the inlet 20a and the main part 24 to each other. The downstream part 26 connects the main part 24 and the outlet 20b to each other. As shown in FIG. 2 to FIG. 4, a rectangular through-hole 28 is provided in a front-side partition wall 24a of the main part 24. The duct 20 is fixed to the DC-DC converter 12 with the cooling fins 14b inserted in the through-hole 28. Thus, the cooling fins 14b are housed in the box-shaped main part 24. As shown in FIG. 2 and FIG. 3, a rear-side partition wall 24b of the main part 24 faces tips of the cooling fins 14b. A packing 40 is provided at a joint between the duct 20 and the DC-DC converter 12. The packing 40 seals the joint between the duct 20 and the DC-DC converter 12. The packing 40 prevents air leakage from the joint.

As shown in FIG. 1 to FIG. 3, the partition wall 24b has a step 60. As shown in FIG. 2 and FIG. 3, the step 60 is a part at which the partition wall 24b shifts in a thickness direction thereof. The step 60 reinforces the partition wall 24b. The step 60 reduces warping of the partition wall 24b. As the step 60 is thus provided, a recess 62 is defined at a part of an inner surface of the partition wall 24b within an area surrounded by the step 60. The recess 62 is disposed at a position facing the cooling fins 14b.

As shown in FIG. 2 and FIG. 3, a cushioning material 70 is fixed to the inner surface of the partition wall 24b of the duct 20. The cushioning material 70 is fixed inside the recess 62. The cushioning material 70 is disposed between the partition wall 24b and the cooling fins 14b. A clearance C2 is left between the cushioning material 70 and the cooling fins 14b. The cushioning material 70 protrudes farther toward the side of the cooling fins 14b than a part 64 of the inner surface of the partition wall 24b around the recess 62. Thus, the clearance C2 between the cushioning material 70 and the cooling fins 14b is narrow. The cushioning material 70 is configured by a closed-cell sponge. Therefore, the cushioning material 70 allows little gas to pass through the inside thereof.

As shown in FIG. 1 and FIG. 4, the blower 30 is connected to the inlet 20a of the duct 20. The blower 30 is an electric blower and sends air through the inlet 20a of the duct 20. A packing 42 is provided at a joint between the duct 20 and the blower 30. The packing 42 seals the joint between the duct 20 and the blower 30. The packing 42 prevents air leakage from the joint.

When the blower 30 is activated, air is sent from the blower 30 into the upstream part 22 of the duct 20, as indicated by arrows 100 in FIG. 4. The air flowing through the upstream part 22 flows from an upper side to the inside of the main part 24, as indicated by arrows 100, 102 in FIG. 3 and FIG. 4. In the main part 24, an air flow passage is defined by a space surrounded by the duct 20 and the heatsink 14. In the main part 24, the air flows from top to bottom. When the air flows through the main part 24, the cooling fins 14b are cooled through heat exchange between the air and the cooling fins 14b. Thus, the DC-DC converter 12 is cooled inside the main part 24. As described above, the cooling fins 14b extend linearly along the up-down direction. In the main part 24, the air flows along the extension direction of the cooling fins 14b (up-down direction). In the main part 24, therefore, the air is less likely to stagnate and the cooling fins 14b are efficiently cooled by the air. As described above, the cushioning material 70 allows little gas to pass through the inside thereof. In the main part 24, therefore, the air flows through clearances C1 (see FIG. 2) between the cooling fins 14b and the clearance C2 between the cushioning material 70 and the cooling fins 14b so as to circumvent the cushioning material 70. Thus, since the cushioning material 70 allows little air to pass through the inside thereof, the air is more likely to flow through the clearances C1, C2. Moreover, since the cushioning material 70 protrudes farther toward the side of the cooling fins 14b than the part 64 around the recess 62, the clearance C2 is narrow. In the main part 24, therefore, the air is more likely to flow through the clearances C1 between the cooling fins 14b. With more air thus flowing through the clearances C1 between the cooling fins 14b, the cooling fins 14b can be cooled more efficiently. As indicated by arrows 102 in FIG. 3, the air having passed through the main part 24 passes through the downstream part 26 and is discharged to the outside through the outlet 20b.

The partition wall 24b has a flat plate shape with a large area, which makes it prone to warping. Although reinforced by the step 60, the partition wall 24b can still warp. The partition wall 24b tends to warp, for example, while the duct 20 is molded by injection molding. In a cooling unit that does not have the cushioning material 70 (hereinafter referred to as a cooling unit of a comparative example), noise is likely to occur when the partition wall 24b has warped. In contrast, the cooling unit 10 of the embodiment generates less noise when the partition wall 24b has warped. In the following, the characteristics of the cooling unit of the comparative example and those of the cooling unit 10 of the embodiment will be described.

Figure 5:
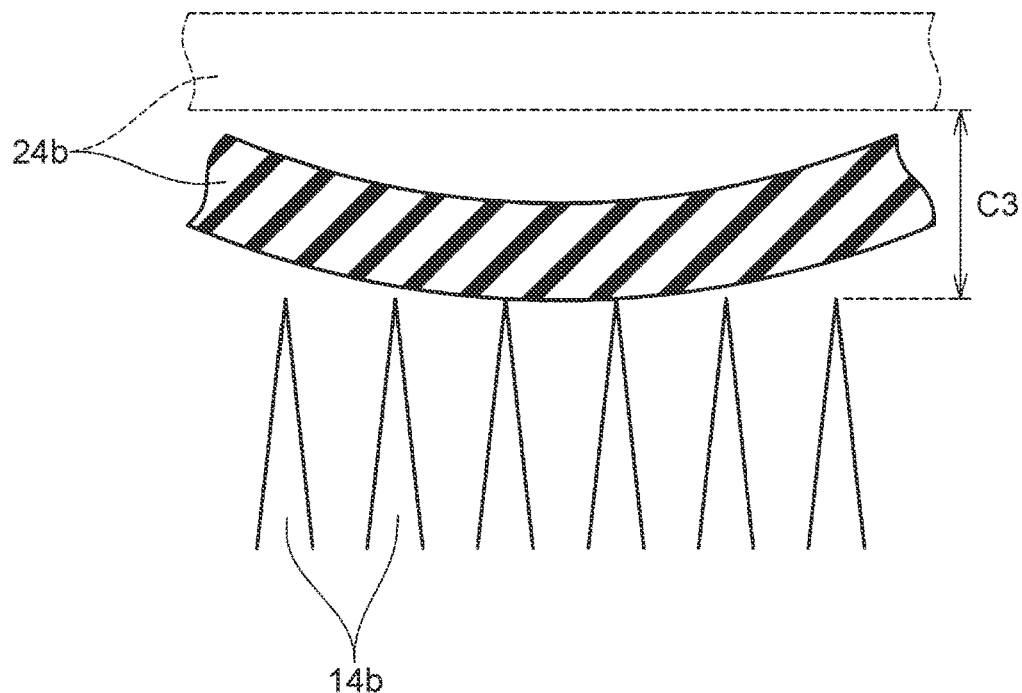
FIG. 5 is a view illustrating warping of a partition wall.

The cooling unit of the comparative example does not have a cushioning material between the partition wall 24b and the cooling fins 14b. Therefore, when the partition wall 24b warps so as to be located closer to the cooling fins 14b, the partition wall 24b comes into contact with some of the cooling fins 14b as shown in FIG. 5. If the partition wall 24b is thus in contact with some of the cooling fins 14b, the partition wall 24b and the cooling fins 14b rub against each other at the contact portions due to vibration, which generates noise. Preventing noise generation in the cooling unit of the comparative example requires securing a wide clearance C3 between the partition wall 24b and the cooling fins 14b such that even when the partition wall 24b warps, the partition wall 24b does not come into contact with the cooling fins 14b. However, if a wide clearance C3 is secured, air is more likely to flow through the clearance C3 and less likely to flow through the clearances C1 (see FIG. 2) between the cooling fins 14b when the partition wall 24b is not warped. As a result, the cooling efficiency of the cooling fins 14b decreases.

Figure 6:
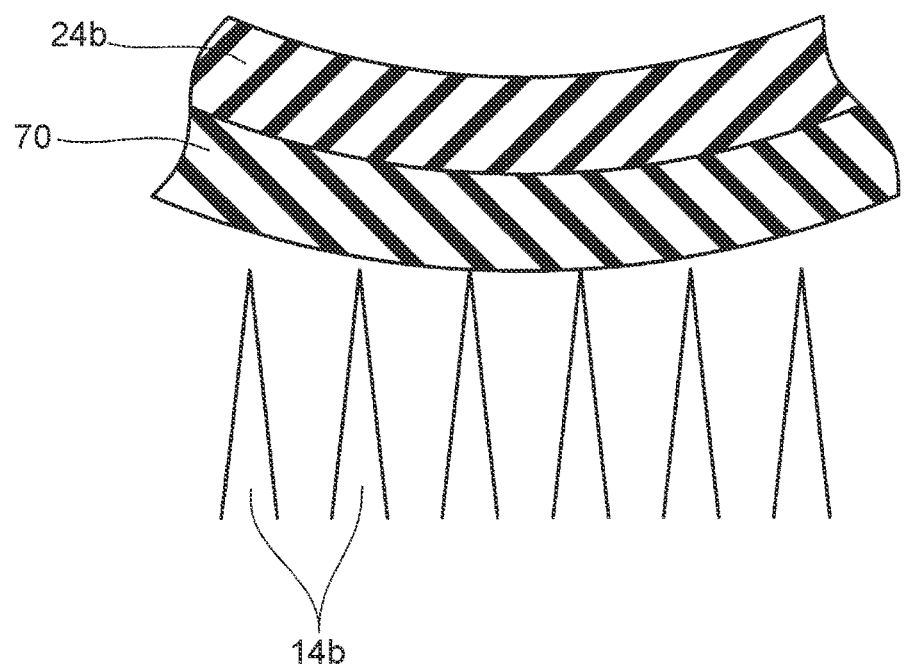
FIG. 6 is a view illustrating warping of the partition wall.

In contrast, the cooling unit 10 of the embodiment has the cushioning material 70 between the partition wall 24b and the cooling fins 14b. Therefore, if the partition wall 24b warps so as to be located closer to the cooling fins 14b, the cushioning material 70 comes into contact with some of the cooling fins 14b as shown in FIG. 6. Since the cushioning material 70 has flexibility, even when the cushioning material 70 and the cooling fins 14b come into contact with each other, noise is not generated from the contact portions. Thus, in the cooling unit 10 of the embodiment, noise is not generated when the cushioning material 70 comes into contact with the cooling fins 14b, which allows the clearance C2 (see FIG. 2 and FIG. 3) between the cushioning material 70 and the cooling fins 14b to be narrowed. Therefore, as described above, air is more likely to flow through the clearances C1 between the cooling fins 14b and the cooling fins 14b can be efficiently cooled.

The cushioning material 70 is configured by a closed-cell sponge in the above-described embodiment, but the cushioning material 70 may be configured by other member. However, if the cushioning material 70 has a closed-cell sponge structure, or a structure that does not allow gas to pass through the inside thereof, the cooling fins 14b can be cooled more efficiently.

Air flows through the duct 20 in the above-described embodiment, but a gas other than air may flow through the duct 20. A liquid (e.g., water) may flow through the duct 20. This means that the cooling unit 10 may be of a liquid-cooled type.

While the embodiment has been described in detail above, this embodiment is merely an example and does not limit the scope of the claims. The technique described in the claims includes various modifications and changes made to the specific examples shown above. The technical elements illustrated in this specification or the drawings exhibit their technical usefulness independently or in various combinations, and the combinations are not limited to those described in the claims as filed. In addition, the technique illustrated in this specification or the drawings can achieve more than one purpose at the same time, and achieving one of the purposes itself proves its technical usefulness.

What is claimed is:

1. A cooling unit comprising:
   a member-to-be-cooled including a plurality of cooling fins;
   a duct that is fixed to the member-to-be-cooled, the duct including a partition wall facing the plurality of cooling fins, and the duct conveying a fluid to around the plurality of cooling fins; and
   a cushioning material disposed between the partition wall and the plurality of cooling fins, and the cushioning material being fixed to the partition wall, wherein
   the cushioning material is spaced apart from distal ends of the plurality of cooling fins such that the duct conveys the fluid between the cushioning member and the plurality of cooling fins.

2. The cooling unit according to claim 1, wherein:
   the plurality of cooling fins extend linearly in one direction along the partition wall; and
   the duct is configured to convey the fluid along the one direction.

3. The cooling unit according to claim 1, wherein the cushioning material has a structure that does not allow the fluid to pass through an inside of the cushioning material.

4. The cooling unit according to claim 1, wherein the cushioning material is configured by a closed-cell sponge.

5. The cooling unit according to claim 1, wherein:
   an inner surface of the partition wall has a recess; and
   the cushioning material is disposed inside the recess.

6. The cooling unit according to claim 5, wherein the cushioning material protrudes farther toward the plurality of cooling fins than a part of the inner surface around the recess.

* * * * *